United States Patent
Tao et al.

(10) Patent No.: US 6,822,324 B2
(45) Date of Patent: Nov. 23, 2004

(54) WAFER-LEVEL PACKAGE WITH A CAVITY AND FABRICATING METHOD THEREOF

(75) Inventors: Su Tao, Kaohsiung (TW); Kuo-Chung Yee, Taipei (TW); Jen-Chieh Kao, Kaohsiung (TW); Chih-Lung Chen, Kaohsiung (TW); Hsing-Jung Liau, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/352,042

(22) Filed: Jan. 28, 2003

(65) Prior Publication Data

US 2003/0193096 A1 Oct. 16, 2003

(30) Foreign Application Priority Data

Apr. 15, 2002 (TW) ........................................ 91107807 A (51) Int. Cl.⁷ .............................................. H01L 23/10
(52) U.S. Cl. ....................... 257/710; 257/698; 257/778; 438/108
(58) Field of Search ................................. 257/704, 710, 257/706, 707, 778, 686, 698, 777, 787; 438/108, 125

(56) References Cited

U.S. PATENT DOCUMENTS

| | | | | | |
|---|---|---|---|---|---|
| 4,285,002 A | * | 8/1981 | Campbell | .................... | 257/704 |
| 4,855,869 A | * | 8/1989 | Tsuji | ........................... | 361/807 |
| 4,903,120 A | * | 2/1990 | Beene et al. | ................ | 257/704 |
| 5,237,204 A | * | 8/1993 | Val | ............................. | 257/698 |
| 5,818,106 A | * | 10/1998 | Kunimatsu | ................. | 257/703 |
| 6,181,008 B1 | * | 1/2001 | Avery et al. | ................ | 257/723 |
| 6,238,949 B1 | * | 5/2001 | Nguyen et al. | ............. | 438/106 |
| 6,362,518 B1 | * | 3/2002 | Yatsuda | ...................... | 257/678 |
| 6,630,725 B1 | * | 10/2003 | Kuo et al. | ................... | 257/659 |
| 6,633,079 B2 | * | 10/2003 | Cheever et al. | ............. | 257/723 |

* cited by examiner

*Primary Examiner*—S. V. Clark (57) ABSTRACT

A wafer-level package with a cavity includes a chip, a substrate, and a seal member. The chip has a micro device and a plurality of bonding pads electrically connected to the micro device. The substrate has a plurality of through conductive vias corresponding and electrically connected to the bonding pads. Each of the bonding pads on the chip is provided with a conductive bump for electrically connecting the bonding pad to the conductive via. The seal member surrounds the package to form a hermetical cavity. The present invention further provides a method for fabricating the wafer-level package with a cavity.

26 Claims, 9 Drawing Sheets

WAFER-LEVEL PACKAGE WITH A CAVITY AND FABRICATING METHOD THEREOF

BACKGROUND OF THE INVENTION

1. Field of the Invention

The present invention relates to a method for fabricating a semiconductor package at wafer level, and more particularly to a method for fabricating a micro device package with a cavity.

2. Description of the Related Art

As electronic devices have become smaller and thinner, the speed and the complexity of IC chip become more and more higher. Accordingly, a need has arisen for higher packaging efficiency. Demand for miniaturization is the primary catalyst driving the usage of advanced packages such as chip scale packages (CSP) and flip chips. Both of them greatly increase the packaging efficiency and reduce the amount of board real estate required when compared with the alternative ball grid array (BGA) and thin small outline package (TSOP). Therefore, recently both of techniques have been applied to the packaging of the micro device.

Figure 1:
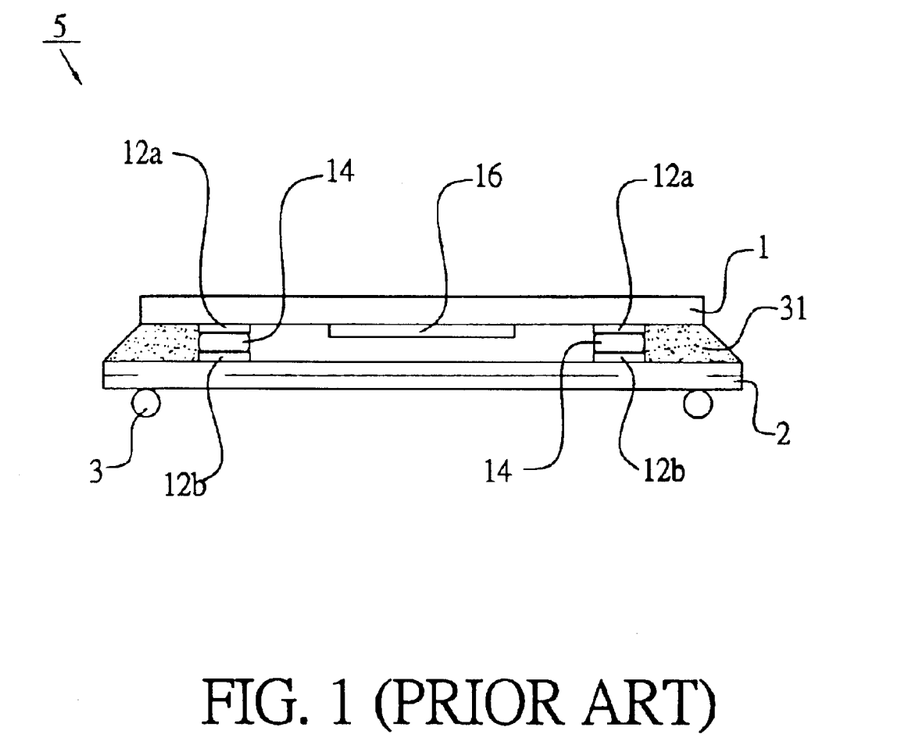
FIG. 1 is a cross section view of a conventional chip scale package of prior art.

Referring now to FIG. 1, it depicts a conventional micro device package 5. The package 5 mainly includes a chip 1 and an electric circuit substrate 2. The chip 1 has a micro device 16 electrically connected to bonding pads 12a on the chip 1. The electric circuit substrate 2 has a top and a bottom surfaces, and the top surface of the electric circuit substrate 2 has a plurality of bonding pads 12b corresponding to bonding pads 12a on the chip 1 and conductive bumps 14 for electrically connecting the bonding pads 12b and the bonding pads 12a. A plurality of solder bumps 3 are disposed on the bottom surface of the electric circuit substrate 2 which is constructed to a single layer or multiple layers for rearranging the bonding pads 12b and electrically connected the bonding pads 12b to the solder bumps 3. The rearrangement of the pads is useful for electrically connecting the micro device package 5 to a motherboard (not shown). A flow-type or no-flow-type underfill material 31 is filled outside the conductive bumps 14 between the chip 1 and the substrate 2 to increase the lifetime of the conductive bumps 14.

However, the conventional micro device package has some drawbacks. One of the drawbacks is that in comparison with wafer level packaging process, the throughput of the conventional packaging is low and the surface contamination of the wafers is high, because the package is encapsulated after the dicing of the wafers. Furthermore, the pitch of the rearranged electric pads of the conventional package (the distance between the adjacent solder bumps 3 as shown in FIG. 1) is larger than the pitch of the bonding pads 12a on the chip 1 (the distance between the adjacent bonding pads 12a as shown in FIG. 1) so as to hinder the high density application of element or circuit. In addition, the process of the underfill material 31 by flowing is a low throughput process, so the packaging efficiency is further decreased.

Accordingly, there exists a need for a method for manufacturing a micro device package at the wafer level so as to solve the above mentioned problems and disadvantages.

SUMMARY OF THE INVENTION

It is a object of the present invention to provide a micro device package with a cavity, which is fabricated at the wafer level and is small in dimension.

It is another object of the present invention to provide a method for mass-produced a package with a cavity at wafer-level to greatly increase the throughput of the packaging.

To achieve the object mentioned above, the present invention provides a wafer-level package with a cavity including a chip, a substrate, and a seal member. The chip has a micro device and a plurality of bonding pads electrically connected to the micro device. The substrate has a plurality of through conductive vias corresponding and electrically connected to the bonding pads. Each of the bonding pads on the chip is provided with a conductive bump for electrically connecting the bonding pad to the conductive via. The seal member surrounds the package to form a hermetical cavity.

The present invention further provides a method for fabricating a package with a cavity at wafer-level, comprising the steps of: (a) providing a wafer including a plurality of chips being separated from each other by scribe lines and each having a plurality of bonding pads; (b) forming a plurality of conductive bumps on the bonding pads of the chips; (c) forming a seal member surrounding each of the chips on the wafer; (d) providing a substrate having the scribe lines corresponding to the scribe lines of the wafer; (e) forming a plurality of conductive vias on the substrate corresponding to the plurality of bonding pads of the chips on the wafer; (f) aligning and bonding the wafer and the substrate together so that a plurality of the conductive bumps on the wafer are respectively electrically connected to the conductive vias of the substrate, and the seal member is disposed between the wafer and the substrate to form a plurality of hermetical cavities; and (g) dicing the bonded the wafer and the substrate to form the individual package.

A wafer-level package with a cavity according to the present invention is characterized that the through vias directly formed in the cap wafer are a type of an electric feed through interconnection structure and the pitch of the conductive vias in the said structure equals to the pitch of the bonding pads on the base wafer, whereby the density of the element of circuit can be increased. In addition, not only does the wafer-level packaging enhance the packaging efficiency, but also the conventional flowed encapsulated process is replaced with the pre-depositing seal member around the base wafer, and thus the packaging efficiency can be further enhanced.

BRIEF DESCRIPTION OF THE DRAWINGS

Other objects, advantages, and novel features of the invention will become more apparent from the following detailed description when taken in conjunction with the accompanying drawings.

FIG. 10b is a schematic top view of the base wafer shown in FIG. 10a.

DETAILED DESCRIPTION OF THE PREFERRED EMBODIMENT

Figure 2:
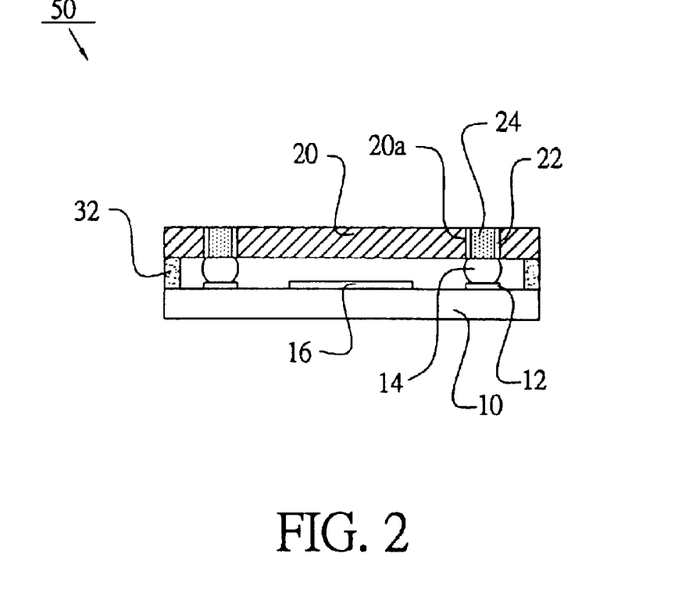
FIG. 2 is a schematic cross section view of a micro device package according to a first embodiment of the present invention.

Referring now to FIG. 2, it depicts a package with a cavity according to a first embodiment of the present invention. The package 50 mainly comprises a base chip 10, a plurality of conductive bumps 14, and a cap chip 20. The base chip 10 has a micro device 16 electrically connected to a plurality of bonding pads 12. The plurality of conductive bumps 14 are formed on the bonding pads 12, respectively. The cap chip 20 has a plurality of conductive vias 20a. The shape, dimension, and amount of the conductive vias 20a depend on the design requirement, such as conductivity thereof, without any limitation. The cap chip 20 is further provided with a plurality of bonding pads (not shown) disposed on the outer surface thereof corresponding to the conductive vias 20a. It will be apparent to those skilled in the art that these bonding pads are electrically connected to the external substrate or printed circuit board (PCB) by bonding wires, solder bumps or the other known conductive structure, whereby the base chip 10 is electrically connected to the external circuit through the conductive bump 14 and the conductive via 20a as well as the bonding wire or the solder bump.

The package 50 is surround and sealed with a seal member 32 to form a hermetical cavity 30a around the micro device 16. The cap chip 20 can be made of a high resistivity semiconductor material, such as single crystal silicon, fiberglass reinforced bismaleimide triazine (BT) resin or FR-4 fiberglass reinforced epoxy resin. Preferably, both of the base chip 10 and the cap chip 20 are made of the same material, such as silicon wafers, to avoid thermal expansion mismatch, and to be handled in the same processes and conditions with normal silicon wafers during the following manufacturing process.

The micro device 16 is disposed on the base chip 10 and can be provided with the micro active device, such as the integrated circuit, the micro mechanics, the moving part, or the micro passive device, such as various sensors. The micro device 16 is electrically connected to the bonding pads 12 through the channels or wires (not shown). Since the package 50 has the hermetical cavity 30a, the moving part of the micro device 16 can be substantially moved within the cavity 30a.

Referring now to FIGS. 3 to 8, they depict the processes for fabricating the package 50 with a cavity according to the present invention. Hereinafter, the same reference numerals indicate the same elements throughout the figures.

Figure 3:
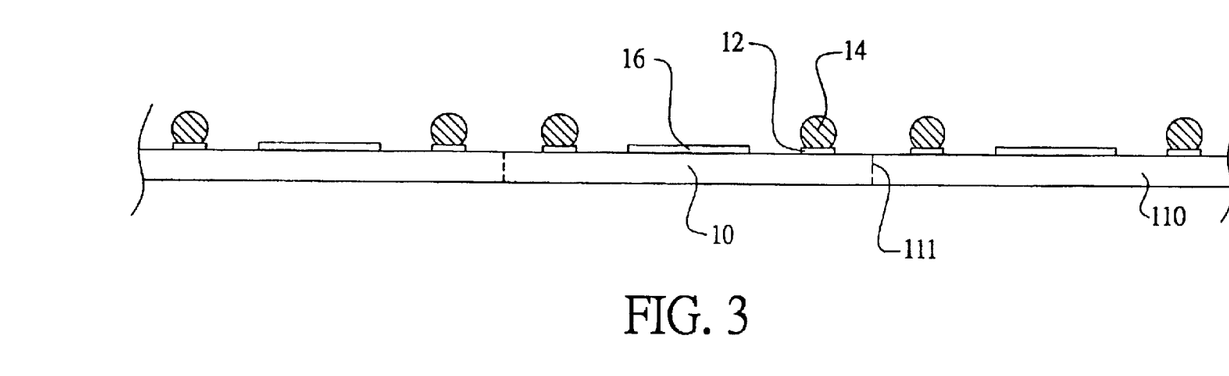
FIGS. 3 to 8 show the process steps for fabricating the micro device package at wafer level according to the first embodiment of the present invention.
Figure 4A:
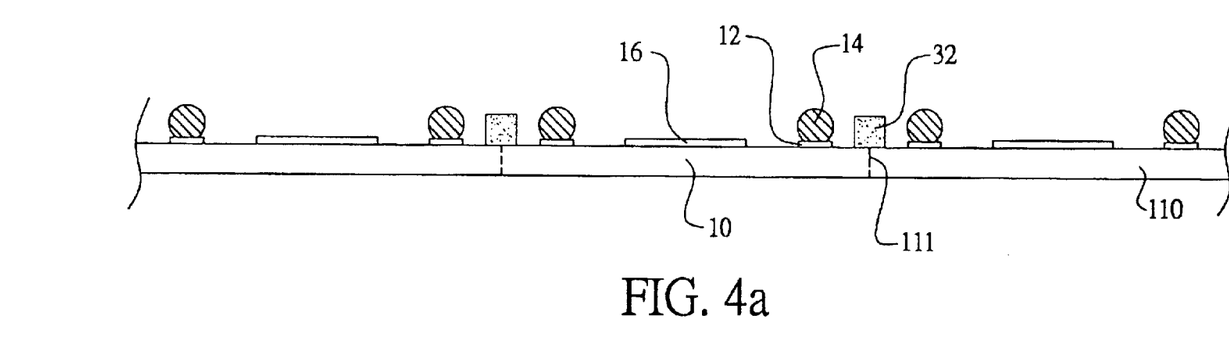
Figure 4B:
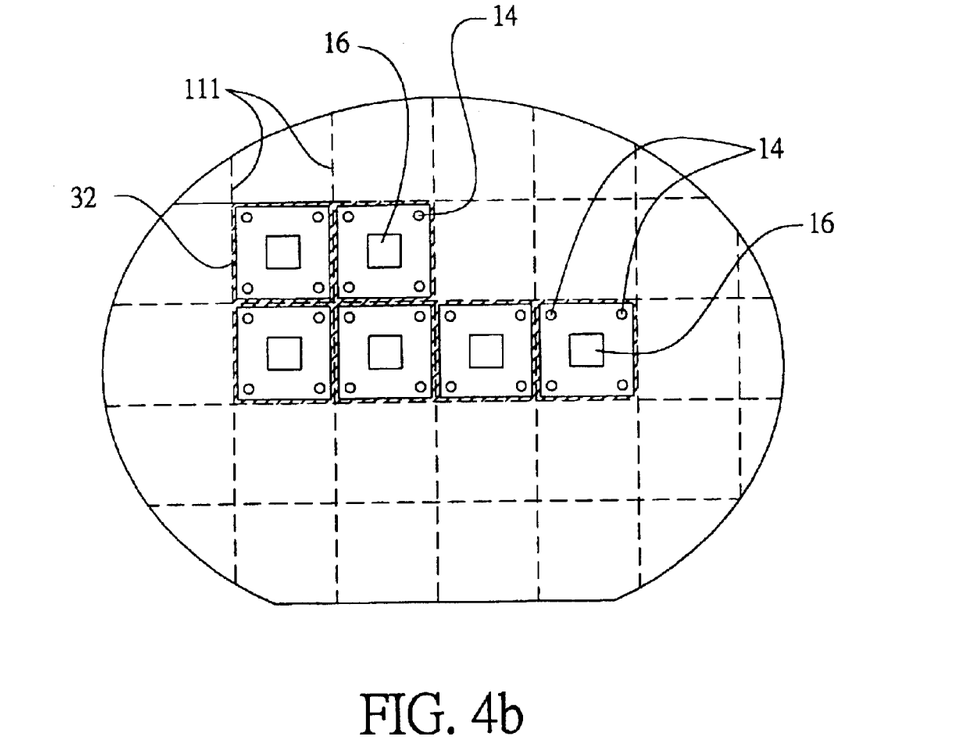

As shown in FIG. 3, a base wafer 110 includes the plurality of base chips 10 separated from each other by a scribe line 111 (as the phantom line shown in FIG. 3; the scribe line 111 is positioned on the top surface of the wafer 10 shown in FIG. 4b). A plurality of bonding pads are disposed on the base wafer 110. The fabricating processes of the bonding pads 12 includes depositing an adhesion layer (not shown) on the base wafer 110, sputtering or evaporating a conductive layer on the adhesive layer, and then etching away the undesired conductive layer by way of a conventional photolithographic process and the pattern transfer. Alternatively, an initial deposition of an adhesive and a conductive layers is performed through the photolithographic process, the photoresist is removed, and then the plurality of bonding pads 12 are formed on the base wafer 110. The number of the bonding pads on the each chip 10 is changeable and depends on the design of the output/input circuit of the chip 10.

A plurality of conductive bumps 14 are respectively formed on the plurality of the corresponding bonding pads 12 through the wafer bump process. The conductive bump 14 can be any type of conductive bumps, such as solder bump, gold bump or polymer bump. Generally, the conductive bump 14 is formed by the conventional bumping technology, i.e., defining an opening over the bonding pad 12 by applying and developing a photoresist, disposing the conductive material into the opening by evaporating, electroplating or printing, removing the photoresist, and then forming the conductive bump 14.

As shown in FIG. 4a, the pre-deposited seal member 32 at wafer level is formed on the base wafer 110. According to the first embodiment of the present invention, the seal member 32 is made of non-conductive material, such as epoxy resin, which surrounds the base chip 10 by printing and then is cured in the curing oven. Alternatively, the seal member 32 is formed by means of printing or photolithographing polyimide to surround the base chip 10. Referring to FIG. 4b, it shows the top planer view of the base wafer 110 including the seal member 32 which surrounds the each chip 10, the conductive bumps 14 and the micro device 16. The centerline of the seal member 32 covers and coincides with the scribe line 111 of the wafer 110.

Figure 5:
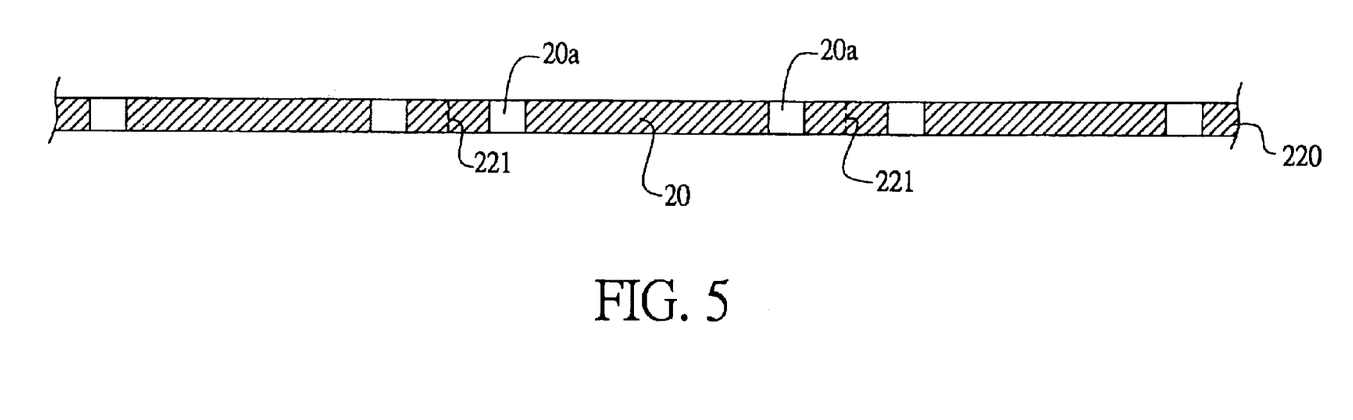
Figure 6:
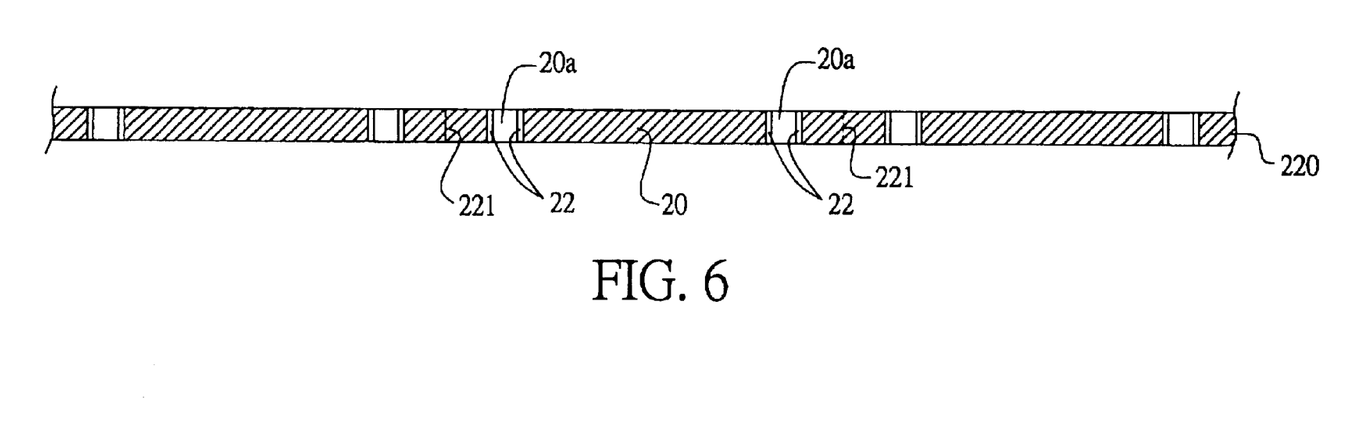
Figure 7:
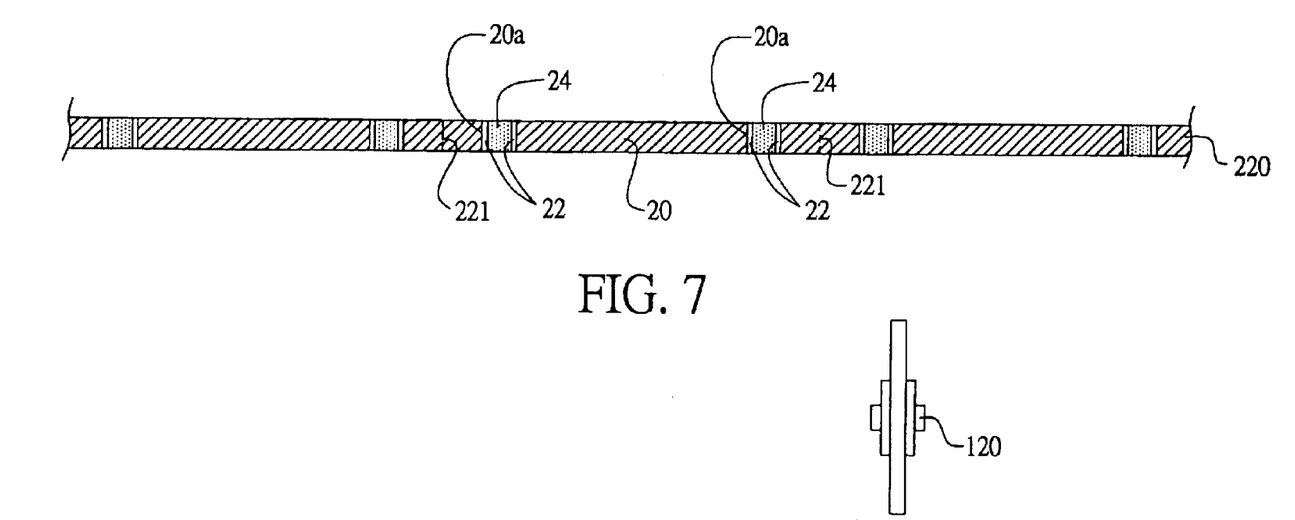

FIGS. 5 to 7 illustrate the substrate feed through process of the cap wafer 220. As shown in FIG. 5, the cap wafer 220 has the plurality of vias 20a and the plurality of cap chips 20 separated from each other by scribe lines 221 (as the phantom line shown in FIG. 5, the scribe line 221 is positioned on the top surface of the wafer 220 shown in FIG. 4b). First, the via or through hole 20a is formed by a drilling process through the cap wafer 220. If the cap wafer 220 is an organic substrate, the drilling process is performed by machining, lasers or photo-etching. The types of the lasers include carbon dioxide laser, YAG (yttrium aluminum garnet) laser, excimer laser, etc., wherein the carbon dioxide laser is preferred. The vias 20a correspond to the conductive bumps 14 on the base wafer 110. If the cap wafer 220 is a glass or a silicon substrate, dry etching is preferred to form the vias 20a. The dry etching is a plasma etching suitable for etching the deep channel of silicon substrates.

FIG. 6 shows that a conductive layer 22 is plated on the inner wall of the through via 20a. FIG. 7 shows that a conductive underfilling 24 is filled into the via 20a and homogenized by reflowing for being in electrical contact with the external. Preferably, the conductive underfilling 24 is the type of the conductive paste, such as the conductive epoxy, silver paste or solder paste. The conductive layer 22 is provided for increasing the conductivity of the via wall and the adhesion of the conductive underfilling 24.

Figure 8:
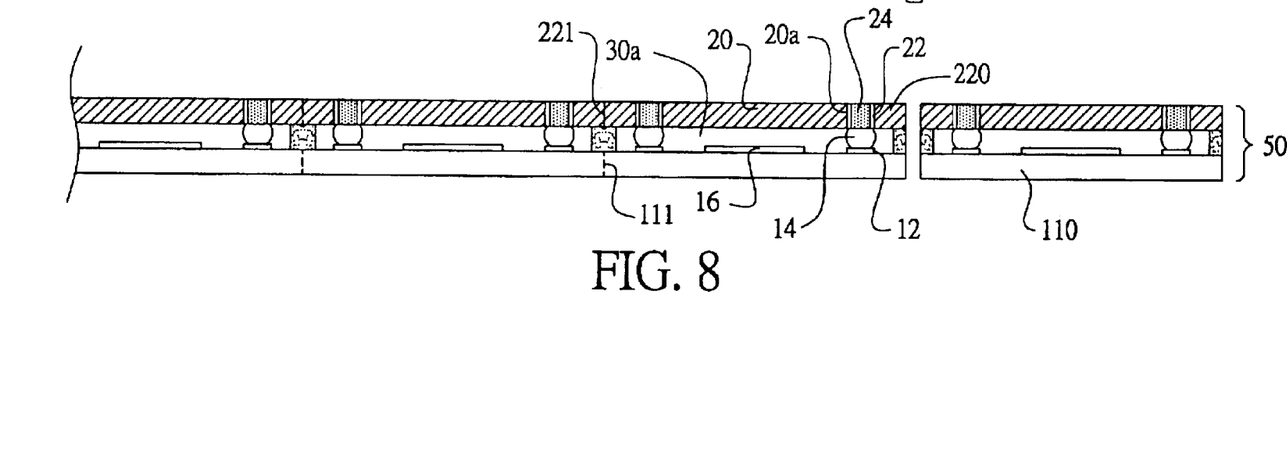

Referring to FIG. 8, it depicts the wafer-to-wafer bonding process, wherein the cap wafer 220 is aligned with the base wafer 110 for aligning the chips 10 with the chips 20 and the conductive bumps 14 with the vias 20a. Then, the base wafer 110 and the cap wafer 220 is bonded by the thermocompression bonding process of the seal member 32 on the base wafer 110 so as to form a bonding wafer 100 as shown in FIG. 8. The bonding wafer 100 includes a plurality of packages 50 provided with the hermetical cavity 30a around the micro device 16.

Finally, the bonding wafer 100 and the seal member 32 are cut along the scribe lines 111, 221 with a dicing blade 120 into the individual package 50.

Figure 9:
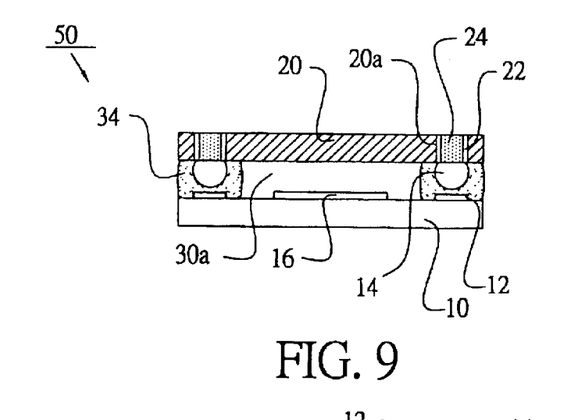
FIG. 9 is a schematic cross section view of a wafer level micro device package according to a second embodiment of the present invention.

Referring now to FIG. 9, it depicts the cross section of the package 70 with a cavity according to the second embodiment of the present invention. The package 70 is similar to the above mentioned package 50 of the first embodiment, and the difference therebetween is that the seal member 34 of the second embodiment is made of the conductive material, and preferably made of ACF (anisotropic conductive adhesive film) formed around the base chip 10 and covering the conductive bumps 14. The base chip 10 is electrically connected to the conductive vias 20a of the cap chip 20 through the conductive seal member 34 and the conductive bumps 14. The seal member 34 has the both functions of the hermetical sealing (forming the hermetical cavity 30a) and the electric conduction (the electrical connection between the chips 10 and 20 ).

Figure 10A:
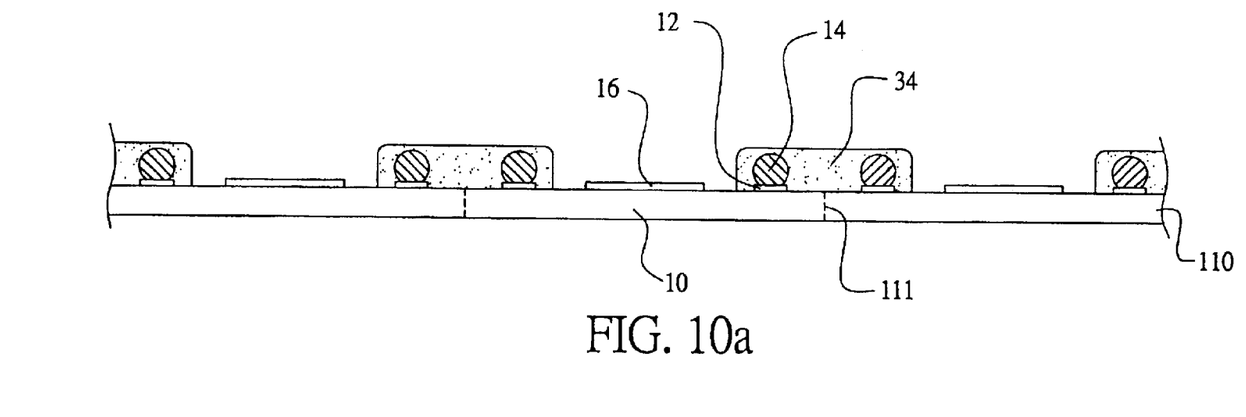
FIG. 10a is a schematic cross section view of the base wafer of the wafer-level micro device package according to the second embodiment of the present invention.
Figure 10B:
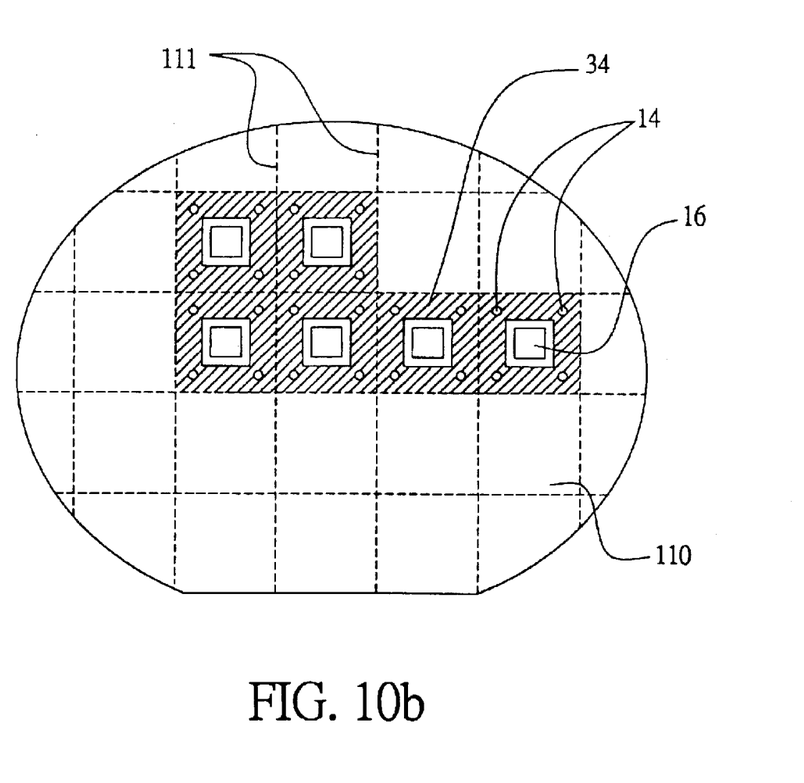

The method for fabricating the package 70 of the second embodiment is similar to the method disclosed in the first embodiment, but the processes illustrated in FIG. 4a, i.e. the processes for pre-depositing the seal member 32 on the base wafer 110, is different. Referring now to 10a and 10b, in the fabricating processes of the package 70, the conductive seal member 34, e.g. ACF, are printed around the plurality of base chips 10 and over the conductive bumps 14 of the chip 10 so as to surround the micro device 16.

Figure 12:
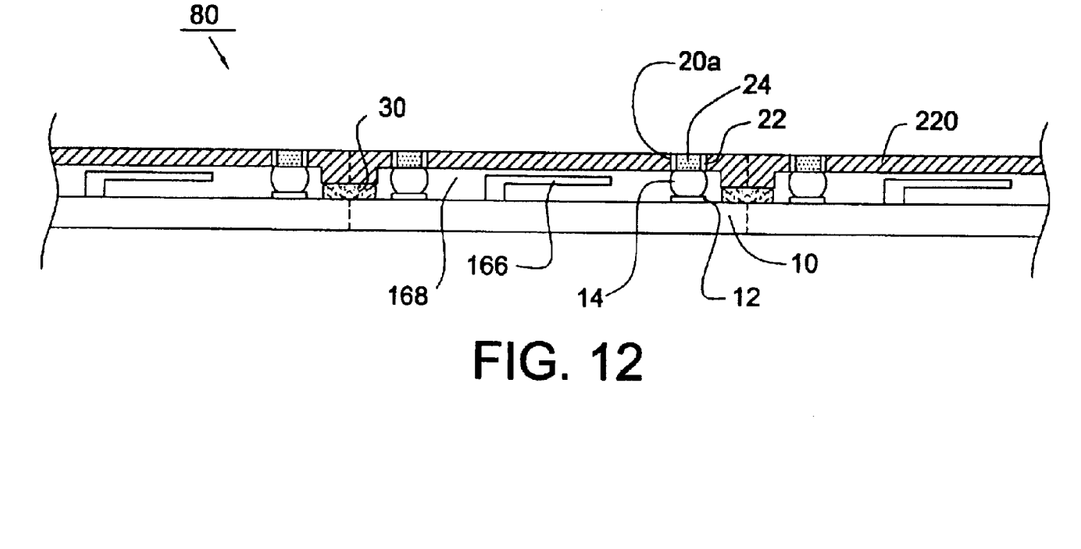
FIG. 12 is a schematic cross section of the wafer-level micro device package according to the third embodiment of the present invention.

Referring now to FIG. 12, it depicts the package 80 with a cavity according to the third embodiment of the present invention. The package 80 is similar to the package 50 disclosed in the first embodiment, but the package 80 is provided with a larger hermetical cavity for the operating of the micro device 166 of the base chip 10. The cap chip 230 of the package 80 is provided with a recess 168 to form a large hermetically cavity, and the thickness of the package 80 is not increased. The seal member 30 of the package 80 may be the non-conductive seal member such as the seal member 32 of the first embodiment, or the conductive seal member such as the seal member 34 of the second embodiment.

Figure 11:
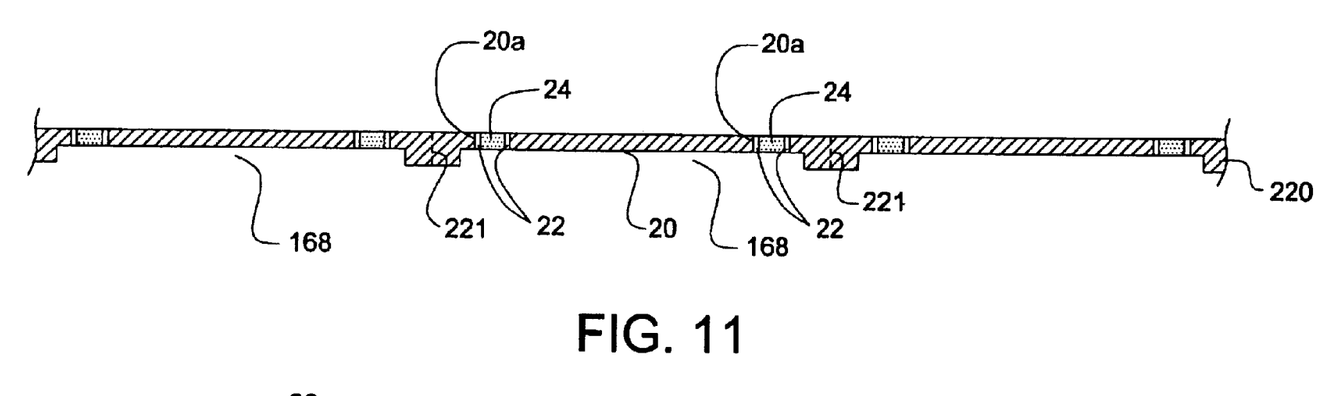
FIG. 11 is a schematic cross section of the cap wafer of the wafer-level micro device package according to a third embodiment in accordance with the present invention.

The method for fabricating the package 80 is similar to the method for fabricating the package 50 of the first embodiment, the difference therebetween is that an etching process is further provided to etch a recess 168 on the cap wafer 230 of the package 80 so as to form a cavity with a large volume.

According to the method of the present invention, the packages are manufactured at wafer level, and thus the packaging efficiency is increased and the risk of the surface contamination of chips is decreased. Furthermore, the through vias or holes directly formed in the cap wafer are a type of an electric feed through interconnection structure and the pitch of the conductive vias in the said structure equals to the pitch of the bonding pads on the base wafer, whereby the density of the element or circuit can be increased. In addition, the conventional flowed encapsulated process is replaced with the pre-depositing seal member around the base wafer, and thus the packaging efficiency can be greatly enhanced.

Although the invention has been explained in relation to its preferred embodiment, it is not used to limit the invention. It is to be understood that many other possible modifications and variations can be made by those skilled in the art without departing from the spirit and scope of the invention as hereinafter claimed.

What is claimed is:

1. A package, comprising:
    a chip having a micro device and a plurality of bonding pads electrically connected to the micro device;
    a substrate having a plurality of conductive through vias corresponding to and electrically connected to the bonding pads; and
    a seal member disposed between the chip and the substrate and surrounding the micro device and the bonding pads to define a cavity in which the micro device and the bonding pads are received wherein all of the bonding pads of the chip are in alignment with the respective vias of the substrate.

2. A package as claimed in claim 1, further comprising, for each of the bonding pads, a conductive bump electrically connecting the bonding pad to the corresponding conductive via.

3. A package as claimed in claim 1, wherein the seal member is an ACF (anisotropic conductive adhesive film) which covers the conductive bumps.

4. A package as claimed in claim 1, wherein the seal member is epoxy resin.

5. A package as claimed in claim 1, wherein the seal member is polyimide.

6. A package as claimed in claim 1, wherein the substrate is selected from the group consisting of an organic substrate, a BT substrate and a glass substrate.

7. A package as claimed in claim 1, wherein the substrate is made of single crystal silicon.

8. A package as claimed in claim 1, wherein the micro device is selected from the group consisting of a integrated circuit, a micro mechanic device, a moving part and a sensor.

9. A package as claimed in claim 1, wherein the substrate has a recess in a region corresponding to the cavity.

10. A method of fabricating a package at wafer-level, said method comprising the steps of:
    providing a wafer including a plurality of chips being separated from each other by first scribe lines, each of said chips having a micro device and a plurality of bonding pads electrically connected to the micro device;
    forming a plurality of conductive bumps on the bonding pads of the chips;
    forming a seal member surrounding the micro device, the bonding pads and the conductive bumps of each of the chips on the wafer;
    providing a substrate having second scribe lines corresponding to the first scribe lines of the wafer;
    forming a plurality of conductive vias in the substrate corresponding to the bonding pads of the chips on the wafer;
    aligning and bonding the wafer and the substrate together so that all of the conductive bumps on the wafer are in alignment with and electrically connected to the respective conductive vias of the substrate, and the seal members are disposed between the wafer and the substrate to form a plurality of hermetical cavities; and
    dicing the bonded wafer and substrate to form a plurality of individual packages.

11. The method as claimed in claim 10, wherein the seal member is an ACF (anisotropic conductive adhesive film) which covers the conductive bumps.

12. The method as claimed in claim 10, wherein the seal member is epoxy resin.

13. The method as claimed in claim 10, wherein the seal member is polyimide.

14. The method as claimed in claim 10, wherein the seal member is formed by a photolithographic process.

15. The method as claimed in claim 10, wherein the step of forming the conductive vias further includes the following steps of:

drilling the substrate to form a plurality of through vias;

plating a conductive layer on the inner walls of the through vias; and filling the through vias with a conductive underfill material.

16. The method as claimed in claim 15, wherein the step of forming the conductive vias further includes the following step of: reflowing the conductive underfill material for homogenizing the conductive underfill material.

17. The method as claimed in claim 15, wherein the step of drilling the substrate is performed by one selected from the group consisting of mechanical drilling, laser drilling, photo-etching drilling and dry-etching drilling.

18. The method as claimed in claim 15, wherein the conductive underfill material is selected from the group consisting of conductive epoxy, solder paste and silver paste.

19. The method as claimed in claim 10, wherein the substrate is selected from the group consisting of organic substrate, a BT substrate and a glass substrate.

20. The method as claimed in claim 10, wherein the substrate is made of single crystal silicon.

21. The method as claimed in claim 10, further comprising the step of: forming a plurality of recesses on the substrate corresponding to the plurality of chips on the wafer.

22. The package as claimed in claim 1, wherein the seal member is disposed on the edges of said chip.

23. The package as claimed in claim 2, wherein the seal member is made of a conductive material which is in direct contact with the conductive bumps.

24. The method as claimed in claim 10, wherein said dicing comprising cutting through said seal members.

25. The method as claimed in claim 10, wherein said seal members are formed in regions corresponding to the first scribe lines, and said dicing includes cutting the wafer and the seal members along said first scribe lines.

26. The method as claimed in claim 10, wherein the seal members are made of a conductive material which is in direct contact with the conductive bumps corresponding to said seal members.

* * * * *